United States Patent [19]
Morgan et al.

[11] Patent Number: 6,108,376
[45] Date of Patent: Aug. 22, 2000

[54] RECEPTION AND DEMODULATION OF WIDELY SPACED PULSE POSITION MODULATED SIGNALS

[76] Inventors: Harry Clark Morgan, 1810 Via Petirrajo, Apt. 7G, Thousand Oaks, Calif. 91360; William Harsha Boyd, 3486 W. Farrell Cir., Newbury Park, Calif. 91320

[21] Appl. No.: 08/764,323

[22] Filed: Dec. 12, 1996

Related U.S. Application Data

[63] Continuation-in-part of application No. 08/337,045, Nov. 10, 1994, Pat. No. 5,586,145.

[51] Int. Cl.[7] .............................. H03K 7/04; H03K 7/06; H03K 9/04; H03K 9/06
[52] U.S. Cl. ......................... 375/239; 370/213; 329/313; 332/112
[58] Field of Search .................................. 375/340, 238, 375/239; 370/212, 213; 329/313, 312, 311; 332/106, 109, 115

[56] References Cited

U.S. PATENT DOCUMENTS

| | | | |
|---|---|---|---|
| 3,366,881 | 1/1968 | Malone et al. | 375/239 |
| 3,873,777 | 3/1975 | Uehara et al. | 375/239 |
| 3,987,447 | 10/1976 | Lockhart, Jr. et al. | 375/239 |
| 4,059,806 | 11/1977 | Vagt, Jr. | 375/239 |
| 4,206,316 | 6/1980 | Burnsweig . | |
| 4,764,769 | 8/1988 | Hayworth et al. | 342/50 |
| 4,912,524 | 3/1990 | Nakamura et al. | 455/608 |
| 4,928,318 | 5/1990 | Ibe et al. | 455/608 |
| 5,450,521 | 9/1995 | Redlich | 388/829 |
| 5,504,462 | 4/1996 | Clanciosi et al. | 332/109 |
| 5,519,361 | 5/1996 | Kim | 332/109 |
| 5,586,145 | 12/1996 | Morgan et al. | 375/239 |
| 5,774,791 | 6/1998 | Strohallen et al. | 455/41 |
| 5,926,301 | 7/1999 | Hirt | 359/154 |

*Primary Examiner*—Chi H. Pham
*Assistant Examiner*—Bryan Webster
*Attorney, Agent, or Firm*—Gene W. West

[57] ABSTRACT

A system for receiving information encoded in a train of pulse position modulated signals and then decoding the pulse train to produce amplitude modulated signals representing the original information includes a circuit for detecting the beginnings of successive PPM signals, a one-shot multivibrator responsive to the beginnings of the PPM signals for producing pulse width signals whose duration varies in accordance with the received intelligence, and an R-C low pass output circuit coupled to the output of the multivibrator to produce amplitude modulated output voltage waves. The R-C circuit has a time constant substantially greater than the unmodulated period between PPM pulses, and produces a rising voltage that spans the time duration of an associated high voltage level square pulse and whose decaying voltage level varies in amplitude in accordance with the maximum voltage attained at the output of the R-C integrator by the trailing edge of the associated high voltage level pulse.

33 Claims, 11 Drawing Sheets

COAX DELAY LINE OR CHARGE LINE

RECEPTION AND DEMODULATION OF WIDELY SPACED PULSE POSITION MODULATED SIGNALS

RELATED APPLICATION

This application is a continuation in part of application Ser. No. 08/337,045 filed Nov. 10, 1994 now U.S. Pat. No. 5,586,145 entitled TRANSMISSION OF ELECTRONIC INFORMATION BY PULSE POSITION MODULATION UTILIZING LOW AVERAGE POWER.

BACKGROUND OF THE INVENTION

As electronic communication becomes more widely used, it becomes increasingly important to be able to transmit information with low average power and with a system of modulation that is highly resistant to interference and noise.

The most common technique in present day communications is to employ modulation for superimposing one or a plurality of messages upon a high-frequency carrier, which is then transmitted through a transmission medium and demodulated at a receiving location to recover separately the intelligence contents of the various messages. The message signals in their original form may be audio, data pulses, video, or of some other character. The medium through which the high-frequency carrier passes may be the air, in the case of radio transmission; coaxial cable; optical fiber cable; or other type of medium.

Many engineering factors are important, including among others initial cost, reliability, and useful life of equipment; operating power required; fidelity of transmission; and susceptibility of the transmission to noise or interference. Another factor that enters into present day situations is the need for government approval for radio transmitting equipment. The government has set a standard for average transmitted power above which a separate government license must be obtained for each installation. It is advantageous in many situations to be able to communicate by electronic means without the need for such government approval.

It has been previously known, however, to utilize a method of communication in which only very short, very widely separated pulses of energy are transmitted. That method does hold a promise of lower susceptibility to noise or interference, and may also avoid the need for a government license. It is that type of system to which the present invention relates.

PRIOR ART

U.S. Pat. No. 3,736,509 issued to Munn on May 29, 1973 shows an avalanche device used with a capacitor to generate pulses. Using a pulse position modulation (PPM) system the transmitter and receiver are not under control of clocks. (See Cols. 1 & 2).

U.S. Pat. No. 3,806,795 issued Apr. 23, 1974 to Morey discloses a transistor Q1 used in the avalanche mode to generate pulses. (See FIG. 4 and Cols. 4 and 5).

U.S. Pat. No. 4,461,317 was issued Feb. 3, 1987 to Fullerton. It discloses a pulse position modulation (PPM) system which generates a very short pulse with a fixed frequency and a variable pulse width. The system utilizes NPN transistors operating in the avalanche mode. The system opens windows of sensitivity to receive incoming pulses. (See FIG. 4; Cols. 2, 3, 4,5, 7, and 8).

U.S. Pat. No. 4,206,316 issued Jun. 3, 1980 to Burnsweig and Bancroft discloses a transmitter-receiver system utilizing pulse position modulation and pulse compression.

SUMMARY OF THE INVENTION

It is an object of the invention to provide a transmission and receiver system which requires only a very low average power. It is another object of the invention to provide a communication method utilizing pulse position modulation. It is yet another object of the invention to minimize susceptibility to interference signals. It is still another object of the invention to provide a low cost high capacity communication system.

According to the present invention, message information in electronic form is transmitted as a series of discrete, widely separated high frequency pulses. Each pulse consists essentially of a single cycle at the transmitted signal frequency, but whose time position represents the intelligence being transmitted. The device for and method of transmission are described and claimed in copending application Ser. No. 08/337,045 filed Nov. 10, 1994 entitled TRANSMISSION OF ELECTRONIC INFORMATION BY PULSE POSITION MODULATION UTILIZING LOW AVERAGE POWER, now U.S. Pat. No. 5,586,145.

Signal reception according to one embodiment of the present invention utilizes an antenna coupled to a series-tuned amplifier. The amplifier produces a train of amplified pulse position modulated signals. The amplified signal if necessary is detected and inverted in preparation for decoding. The decoding is accomplished by utilizing a monostable multivibrator to produce a pulse width modulated signal which is then fed to a low-pass filter operating in its near linear region to produce an amplitude modulated signal.

The presently preferred embodiment is a low cost system that accomplishes decoding without the use of transmitter synchronized clock signals and has an advantage of shutting out noise between received pulses.

The amplitude modulated signal can be fed to an audio amplifier to reproduce an original audio signal. The occurrence times of the amplitude changes in the output signals may not correspond precisely to the occurrence times of the original periodic samples, but no substantial distortion of the information occurs.

THE INFORMATION TRANSMISSION SYSTEM (FIG. 1)

Figure 1:
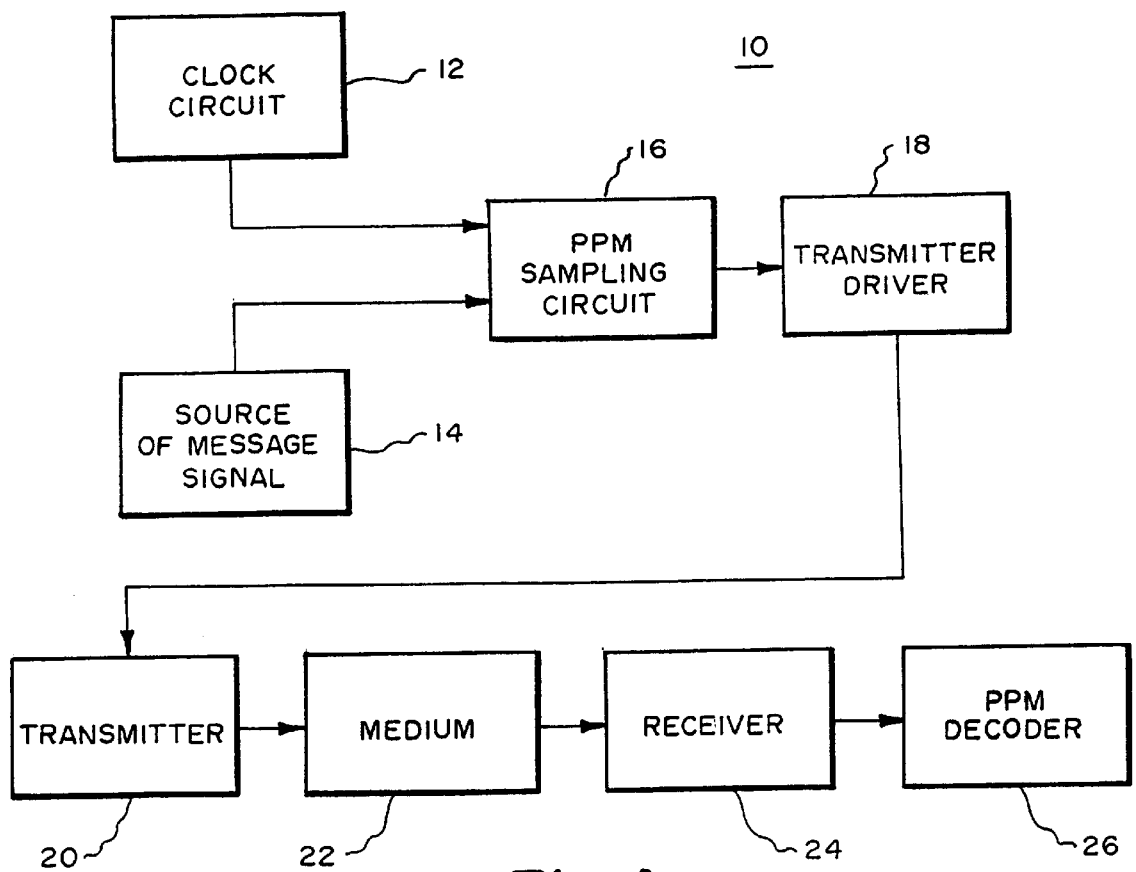
FIG. 1 is a schematic block drawing of a signal modulation, transmission, reception, and demodulation system in accordance with the present invention.

Referring now in particular to FIG. 1, it shows in a block diagram form an information transmission system 10 for signal modulation, transmission, reception, and demodulation in accordance with the present invention. A clock circuit 12 provides a periodic timing signal, at a repetition rate which may for example be about 16 kilohertz or 16,000 cycles per second. A source 14 provides an original message signal which may, for example, be an audio signal such as a music signal. The outputs of the clock circuit 12 and the signal source 14 are applied to a PPM sampling circuit 16.

From the sampling circuit 16 the output pulses are supplied to a transmitter driver 18, producing pulses of very short duration which in turn energize a transmitter 20. High-frequency pulse signals, in a spaced series in accordance with the PPM scheme, are applied from the transmitter 20 to a transmission medium 22. In the case of ordinary radio transmission, cordless phones, cellular phones, or the like, the transmission medium is air. A receiver 24 receives the transmitted information and applies it to a PPM decoder 26 where the original message information is recovered.

THE SIGNAL MODULATION CIRCUITRY (FIGS. 2 & 3)

Figure 2A:
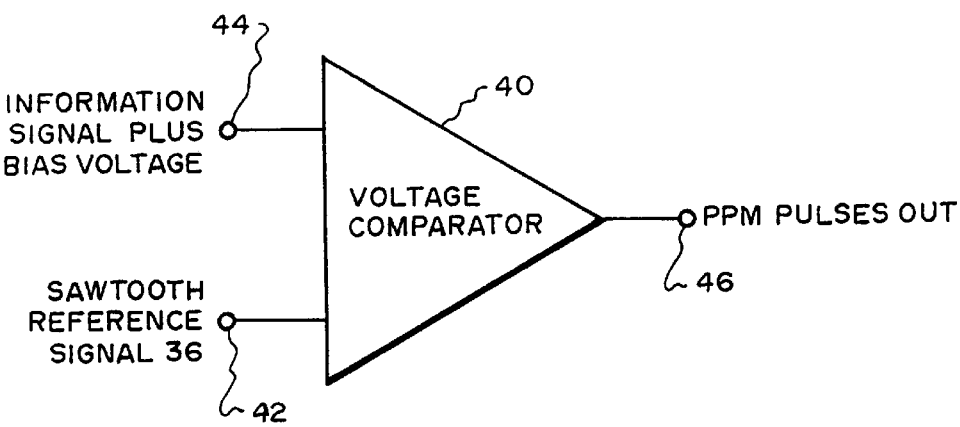
FIG. 2(a) is a schematic block diagram of the presently preferred form of the signal sampling circuit.
Figure 2B:
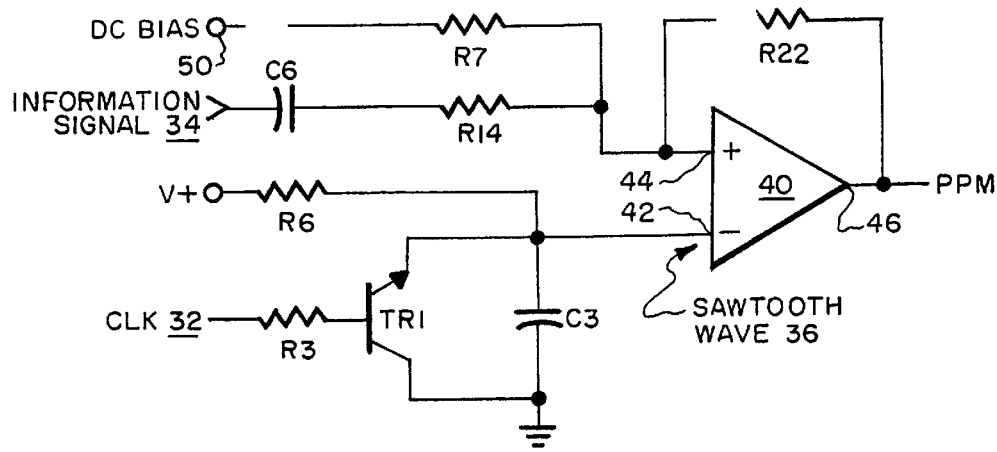
FIG. 2(b) is a schematic circuit diagram of the presently preferred form of the signal sampling circuit.
Figure 3:
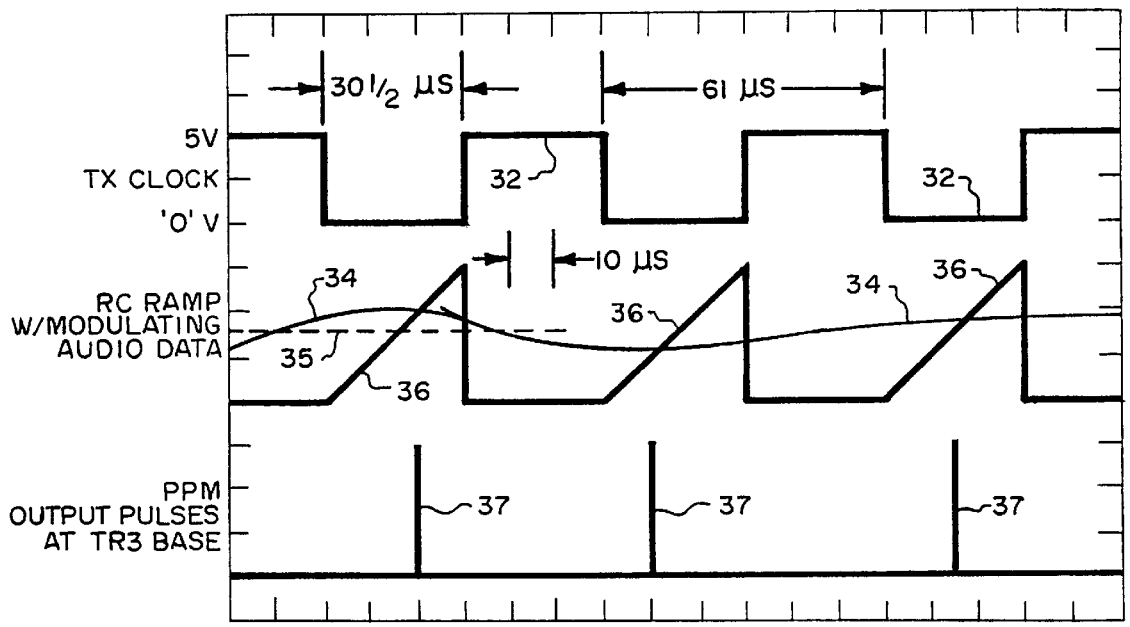
FIG. 3 illustrates voltage waveforms and time relationships in the sampling circuit of FIG. 2 in producing pulse position modulation output pulses in response to the information signal.

FIG. 2(a) is a schematic block diagram of the presently preferred form of the signal sampling circuit while FIG. 2(b) is a schematic diagram of its presently preferred circuitry. FIG. 3 illustrates voltage waveforms occurring in the sampling circuit of FIG. 2(b) in sampling an input information signal to produce position modulation (PPM) output pulses.

As shown in FIG. 3 the clock pulse waveform is designated as 32. The clock signal 32, FIGS. 2(b) and 3, is an essentially square-wave periodic reference signal. It is applied through a first resistor R3 to the base of a transistor TR1, whose collector is grounded while its emitter is connected to the input terminal 42 of the comparator. A positive voltage V+ is applied through a second resistor R6 to the emitter of transistor TR1. A capacitor C3 is connected between emitter and collector of TR1.

The operation is such that in response to the low level output of the clock signal, the cooperative action of second resistor R6 and capacitor C3 produces a sawtooth voltage ramp 36 that is applied to the inverting input terminal 42 of comparator 40. The values of the circuit constants are such that the low output of the clock signal ends at no more than about 10% of the R-C charging curve, thus ensuring a linear ramp. When the clock output level rises to +5 volts, the transistor TR1 turns on hard and the charge on capacitor C3 is shorted through TR1, thus ensuring that the voltage applied to the inverting input 42 is reliably at zero. The next voltage ramp starts only in response to the next occurrence of the low level output of the clock signal, which turns off TR1. Thus, TR1 acts as an on/off switch. As shown in FIG. 3, the sawtooth wave generator is operated by the clock circuit and is responsive to each periodic occurrence of the reference signal for generating a sawtooth ramp wave having a resting cycle whose duration is approximately as great as the sawtooth ramp itself.

A comparator 40 has a first or inverting input 42 to which a sawtooth reference signal 36 is supplied. A direct voltage bias is added to the message or information signal 34 to produce a composite signal. This composite signal is applied through a capacitor C6 and resistor R14 to the positive or non-inverting input terminal 44 of the comparator. A D. C. bias is also applied from a source 50 through a resistor R7 to the non-inverting input terminal 44. A positive feedback resistor R22 is also connected from the comparator output terminal 46 back to the input terminal 44, to speed up the transition through the active input region, which results in a faster comparator fall time.

Upon coincidence of the sawtooth voltage ramp 36 and the composite waveform; i.e., when their voltage difference equals zero, negative PPM output pulses are produced at the single output terminal 46 of the comparator. A transistor inverter, not specifically shown in the drawings, is then used after the comparator output, to produce positive PPM output pulses. These PPM pulses are initially several microseconds in time duration. After the pulses are applied through capacitor C9 to the base of transistor TR3, as shown in FIG. 4(b), they are differentiated and become pulses 37 having a duration far less than a microsecond, such as 20 nanoseconds.

In the circuit of FIG. 2(b) the preferred circuit values are: the comparator is an LM339; C3 has a value of 1.1 nanofarad; resistor R6 has a value of 512 k ohms; and transistor TR1 is an N-P-N transistor such as a type 2N2222. The voltage source V+ is preferably 5 volts; D. C. bias source 50 is about +200 millivolts; the value of R7 is 10 k ohms; and the value of R14 is 330 k ohms. R3 is 15 k ohms. Capacitor C6 is 0.1 microfarad. The value of the feedback resistor R22 is 10 megohms.

As shown in FIG. 3, the action of the comparator circuit is then such that output pulses 37 are of very short but essentially constant duration, but each being varied in time relative to the associated clock reference signal by an amount proportional to the then existing amplitude of the information signal.

An alternate arrangement of the circuit of FIG. 2(b) would reverse the collector and emitter connections of TR1.

THE DRIVER AND TRANSMITTER CIRCUITRY

(FIGS. 4 and 5)

Figure 4A:
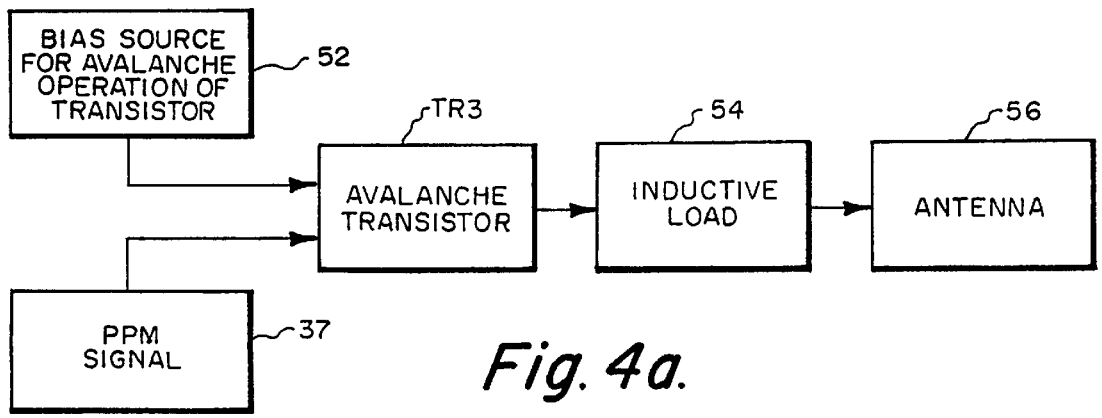
FIG. 4(a) is a schematic block diagram of the presently preferred form of the transmitter driver circuit and transmitter.
Figure 4B:
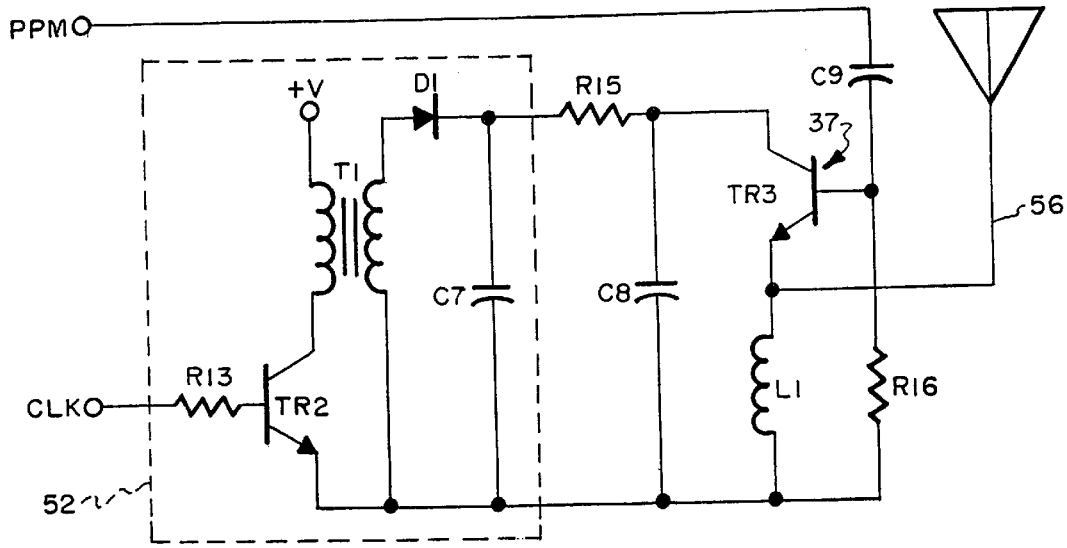
FIG. 4(b) is a schematic circuit diagram of the presently preferred form of the transmitter driver and transmitter.

FIGS. 4(a) and 4(b) illustrate the presently preferred form of the transmitter driver and transmitter circuit, i.e., an electrical circuit for generating intermittent high frequency pulses of extremely brief duration. A critical part of the driver circuit is a transistor TR3 that is operated in the avalanche mode. As shown in FIG. 4(a), a bias source 52 is provided for biasing the transistor for operation in the avalanche mode. The PPM signal 37 is also applied to the transistor, which drives an inductive load 54 that is coupled to an antenna 56.

As shown in FIG. 4(b), the bias source 52 is provided by a transformer T1 that has its primary winding fed from the clock circuit through a resistor R13 and transistor TR2 to provide an alternating voltage to a diode D1 that, in turn, maintains a fixed bias in the range of about +100 to +130 volts across a capacitor C7. This bias voltage is then available to bias the collector-emitter path of the avalanche transistor TR3 near its avalanche breakdown voltage.

The bias voltage of about +100 to +130 volts is also applied through a large resistor R15 across a charging capacitor C8, which is in a position to dump a large charge through the avalanche transistor whenever the proper bias conditions exist. An inductor L1 comprising the inductive load 54 is connected between the emitter of TR3 and ground. The collector of TR3, the charging capacitor C8, inductor L1, and the emitter of TR3, are connected in a series loop circuit. Thus the charging capacitor C8 is coupled between the inductor and the collector of transistor TR3 to form a series loop circuit with the emitter-collector conduction path of the transistor.

The bias source 52 and resistor R15 also provide a charging circuit for supplying a charge to capacitor C8 so that the capacitor will hold a charge ready to be discharged through the avalanche transistor. The charging resistor R15 is connected between the bias voltage source 52 and the collector of transistor TR3, for biasing the transistor near its avalanche breakdown voltage as well as supplying a charge to the charging capacitor C8 that may be discharged through said avalanche transistor.

A bias resistor R16 is connected between the base of TR3 and ground. Alternatively, this bias resistor may be connected between the base of said transistor and its emitter, at the other end of the inductor L1.

The PPM pulses after being applied through a coupling capacitor C9 to the base of transistor TR3 provide intermittent triggering pulses 37 to the transistor base to produce an avalanche of current from the charging capacitor C8 through the transistor in response to each triggering pulse.

It is important that the charging circuit is also adapted to re-charge the charging capacitor C8 at a sufficiently slow rate so that the total avalanche current discharged through the transistor is essentially limited to the charge previously stored on the charging capacitor. The capacity of the charging capacitor, the maximum voltage applied to the charging capacitor, and the time interval between successive triggering pulses, are such as to avoid destruction of said transistor.

In the biasing voltage circuit of FIG. 4(b) the preferred circuit values are as follows. R13 has the value 4.7 k ohms. Transistor TR2 is of type 2N2222. Diode D1 is type 1N3070. Capacitor C7 has the value of 0.1 microfarad.

For the operative portion of the circuit of FIG. 4(b) the preferred circuit values include a type 2N2222 transistor as TR3; capacity of 68 picofarads for capacitor C8; resistance of 100 k ohms for resistor R15; and a value of one-half micro-henries for the inductor L1. Coupling capacitor C9 is 10 picofarads and the transistor biasing resistor R16 is 4.7 k ohms.

Figure 4C:
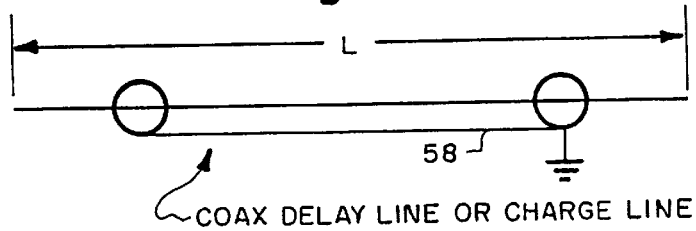
FIG. 4(c) is a schematic drawing of a delay line preferably used as the charging capacitor in the transmitter driver.

FIG. 4(c) is a schematic drawing of a delay line 58 operating as a charge storage device and preferably used as the charging capacitor C8 in the transmitter driver. The length of the delay line is preferably selected to an output pulse whose period is about one-quarter the period of the single cycle wave to be generated.

When an output PPM pulse is applied to the base of transistor TR3, the transistor immediately conducts in avalanche fashion, producing a large current flow. The result is that a large pulse of energy is applied to the inductor circuit.

Figure 5A:
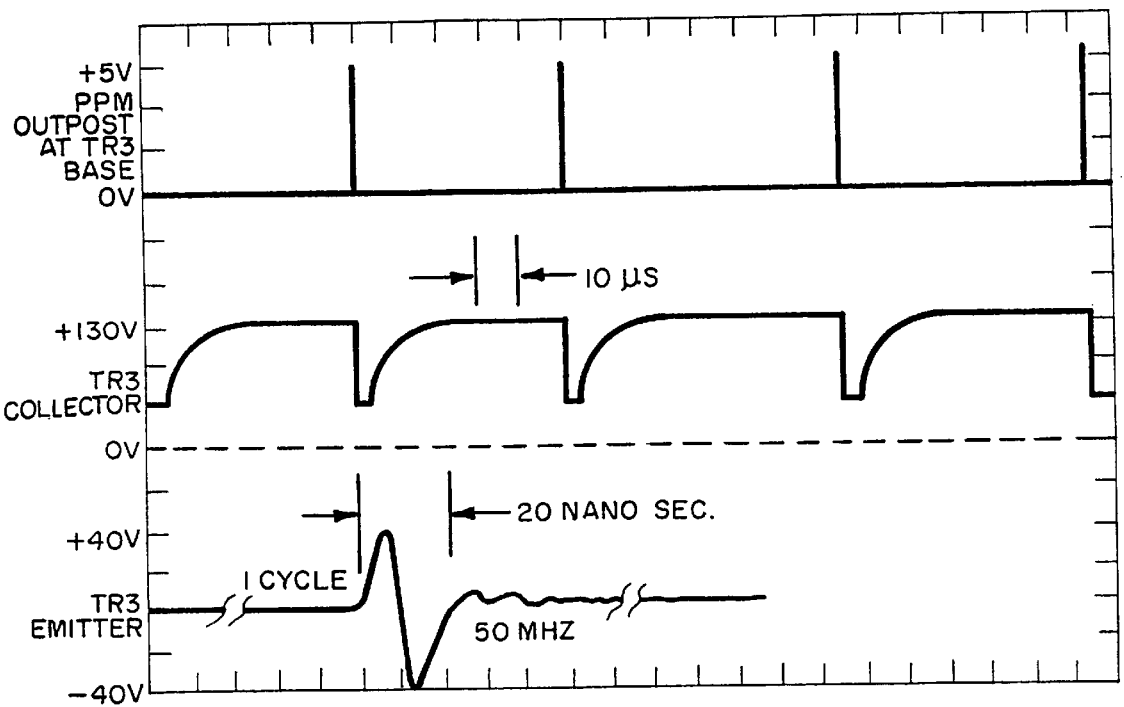
FIG. 5(a) illustrates voltage waveforms occurring in the transmitter driver and transmitter circuits of FIG. 4.

FIG. 5(a) illustrates waveforms occurring in the transmitter driver and transmitter in response to the positive PPM output pulses. The PPM voltage pulses 37 at the base of TR3, and the collector voltage, are separately shown in their relative time relationships. As there shown, voltage pulses received through coupling capacitor C9 and reaching the transistor base have a maximum positive amplitude of about 5 volts and a time duration of about 20 nanoseconds. The collector voltage drops abruptly from +130 volts to near zero volts, remaining at that level for a similar time period. In FIG. 5(a) the voltage on the emitter of TR3, however, is shown on a different and greatly enlarged time scale.

Figure 5B:
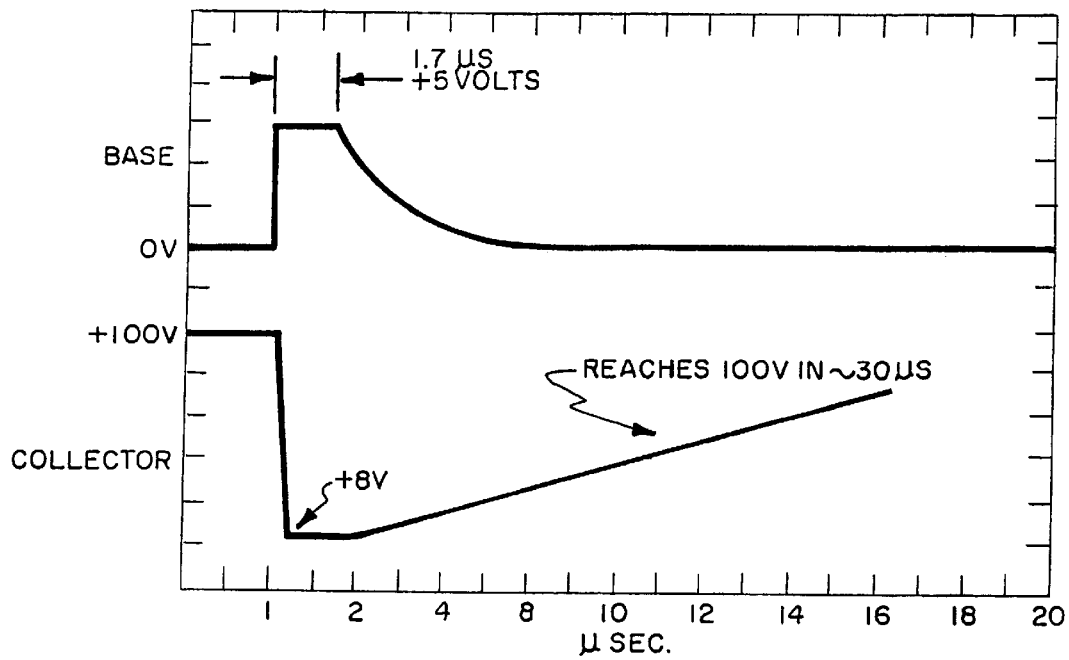
FIG. 5(b) shows the time relationships for the base and collector voltage waveforms in the driver circuit of FIG. 4(b)
Figure 5C:
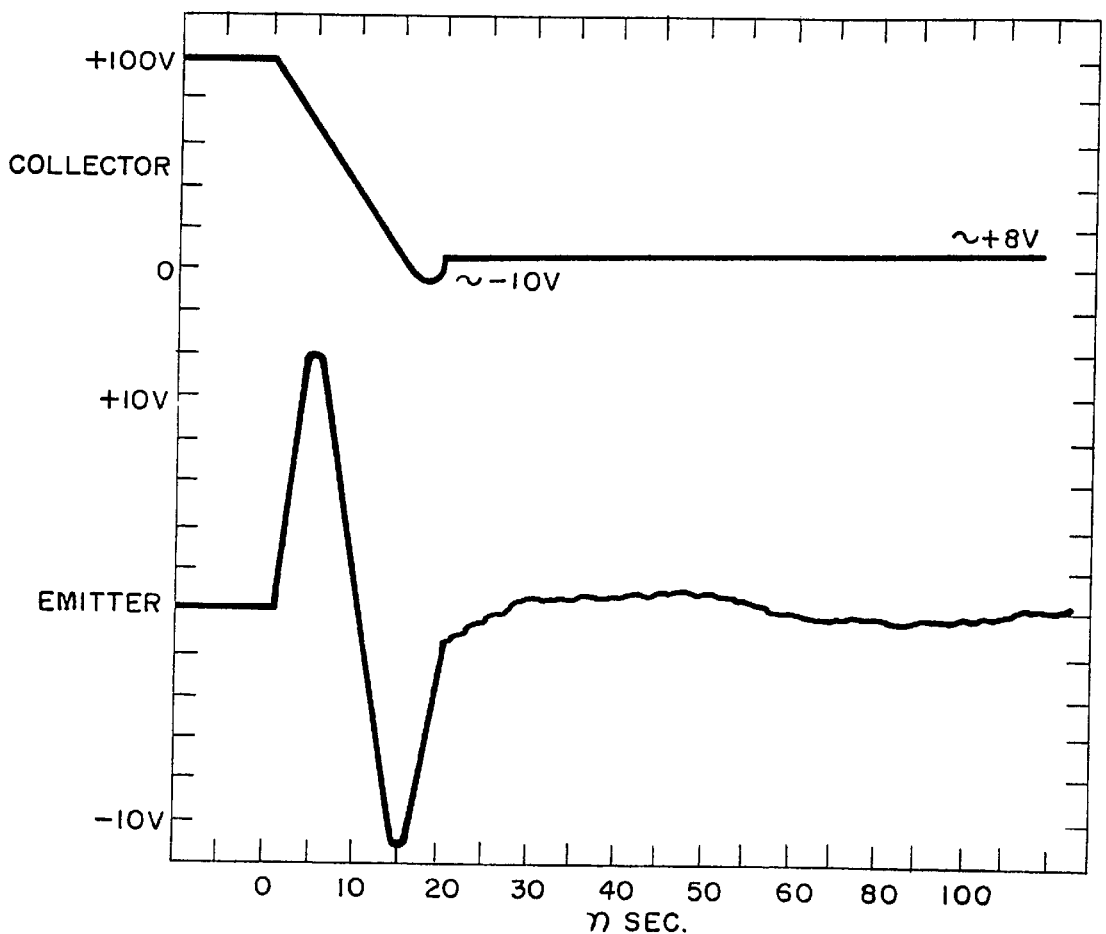
FIG. 5(c) shows, on a greatly expanded time scale, the time relationships for the collector and emitter voltage waveforms in the driver circuit of FIG. 4(b)

FIG. 5(b), on a greatly expanded microsecond time scale, shows in much more detail the time relationships for the base and collector voltage waveforms in the driver circuit of FIG. 4(b). FIG. 5(c) shows the time relationships for the collector and emitter voltage waveforms on an even further expanded nanosecond time scale. The waveforms of FIGS. 5(b) and 5(c) were taken from actual oscilloscope measurements on the circuitry of the preferred embodiment.

Thus as shown in FIG. 5(b), the base voltage changes from zero to +5 volts for about twenty nanoseconds. The collector voltage drops abruptly from its maximum value of +100 or +130 to about +8 volts, remaining at that level for the balance of a two-microsecond period before returning back to its normal voltage in a rising path that requires about 30 microseconds.

As further shown in FIG. 5(c), the collector in less than 20 nanoseconds drops from its normal positive voltage to about −10 volts, then returns to the +8 volt level, remaining essentially at that value for many nanoseconds before rising very much, although it does eventually rise back to its original voltage. During that same period of time the emitter makes a sharp voltage pulse from a normal zero potential to about +12 volts, then to about −12 volts, essentially completing a full and nearly perfect sine wave within twenty nanoseconds. At the end of the 20 nanoseconds there is some limited oscillation of the voltage about the zero reference line.

In general, there is thus disclosed an electrical circuit for generating intermittent high frequency pulses of extremely brief duration. The transistor having a base, a collector, and an emitter, has a resistance R in a forward conduction path from its collector through one of its base and emitter. The inductor has an inductance value L. The inductor is connected in series with the forward conduction path of the transistor. Voltage means are provided for placing the forward conduction path of the transistor near its breakdown condition. Triggering means is also provided for actuating the transistor so that its forward conduction path breaks down at least momentarily and conducts in the avalanche mode. Circuit means associated with the voltage means is also provided for supplying a large current to the forward conduction path of the transistor during its breakdown mode, whereby the inductor produces essentially a single sine wave cycle of voltage representing an oscillation frequency determined essentially by the ratio of L to R. In the particular embodiment here described the forward conduction path of the transistor is the collector-emitter path. It is also possible, by appropriate rearrangement of the circuit, to utilize instead the collector-base forward conduction path of the transistor.

ALTERNATE FORMS

(FIGS. 8–10)

Figure 8:
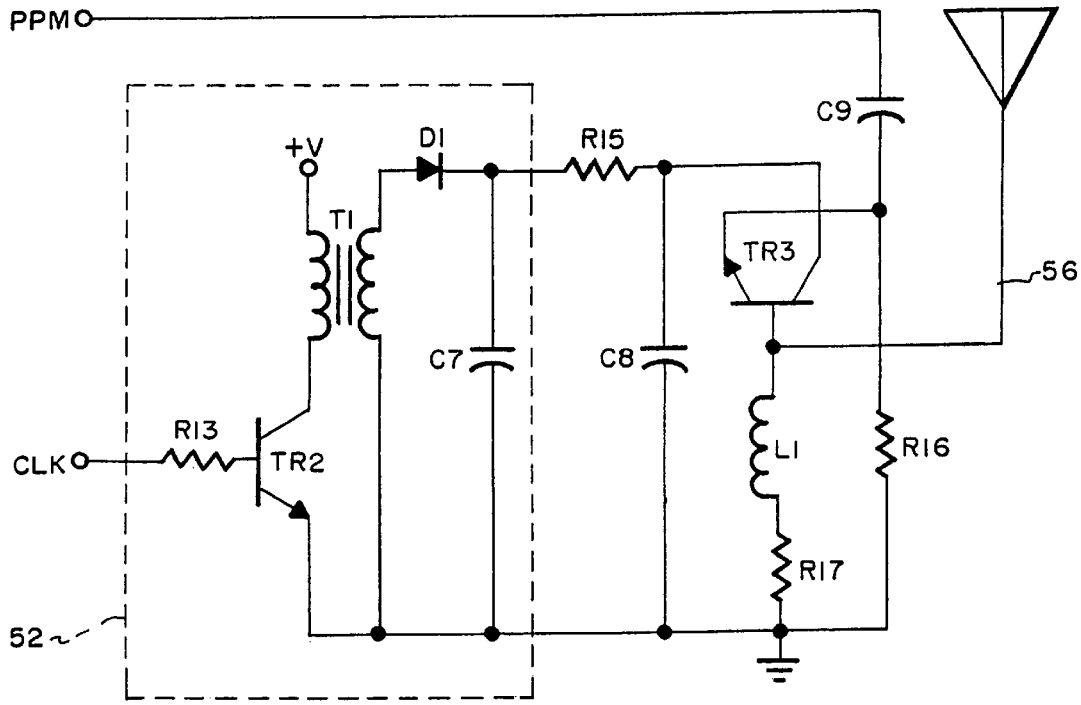
FIG. 8 is a schematic circuit diagram of an alternate form of the transmitter driver and transmitter.

FIG. 8 is a schematic circuit diagram of an alternate form of the transmitter driver and transmitter, which may in fact be preferable to the circuit of FIG. 4(b). The voltage bias circuit 52 is the same as before. The circuit values R15, C8, TR3, L1, C9, R16, and antenna 56 are also the same as before. However, the triggering pulses are applied through C9 to the emitter of TR3; and inductor L1 and antenna 56 are connected to the base of TR3. A resistor R17 is connected in series between the other end of L1 and ground. Resistor R16 is connected between the emitter of TR3 and ground.

The function of resistor R17 can be very important. The effective frequency of the single sine wave cycle produced by the circuit is determined by the ratio of L to R, where R includes not only the resistance of the transistor during forward conductance but also the resistance value of R17. The value selected for R17 will usually be small, such as about ten ohms. A small change in the value of R17 will create a corresponding change in the period of the single cycle of the generated sine wave, which in layman's terms could be described as a change in the length or duration of the sine wave cycle and hence of its apparent frequency.

The resistor R17 may also be incorporated into the circuit of FIG. 4(b) for the same purpose as in FIG. 8.

Figure 9:
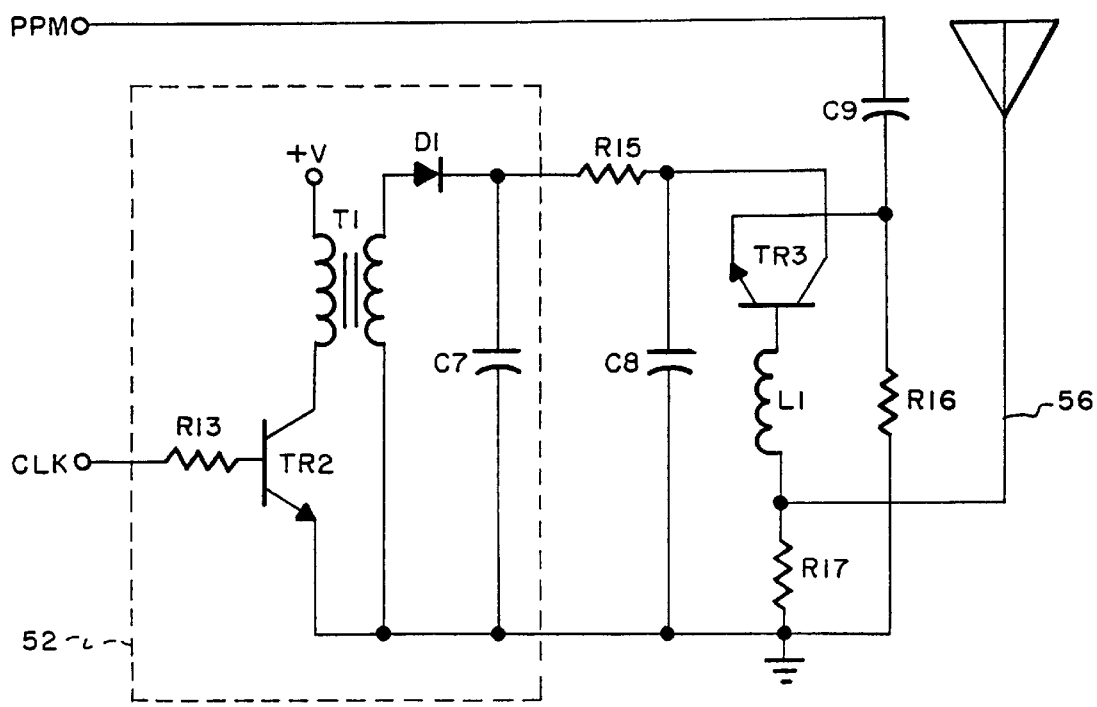
FIG. 9 is a schematic circuit diagram of another alternate form of the transmitter driver and transmitter.

FIG. 9 is a schematic circuit diagram of another alternate form of the transmitter driver and transmitter. The only change as compared to FIG. 8 is that the antenna 56 is connected to the juncture of inductor L1 and resistor R17.

Figure 10:
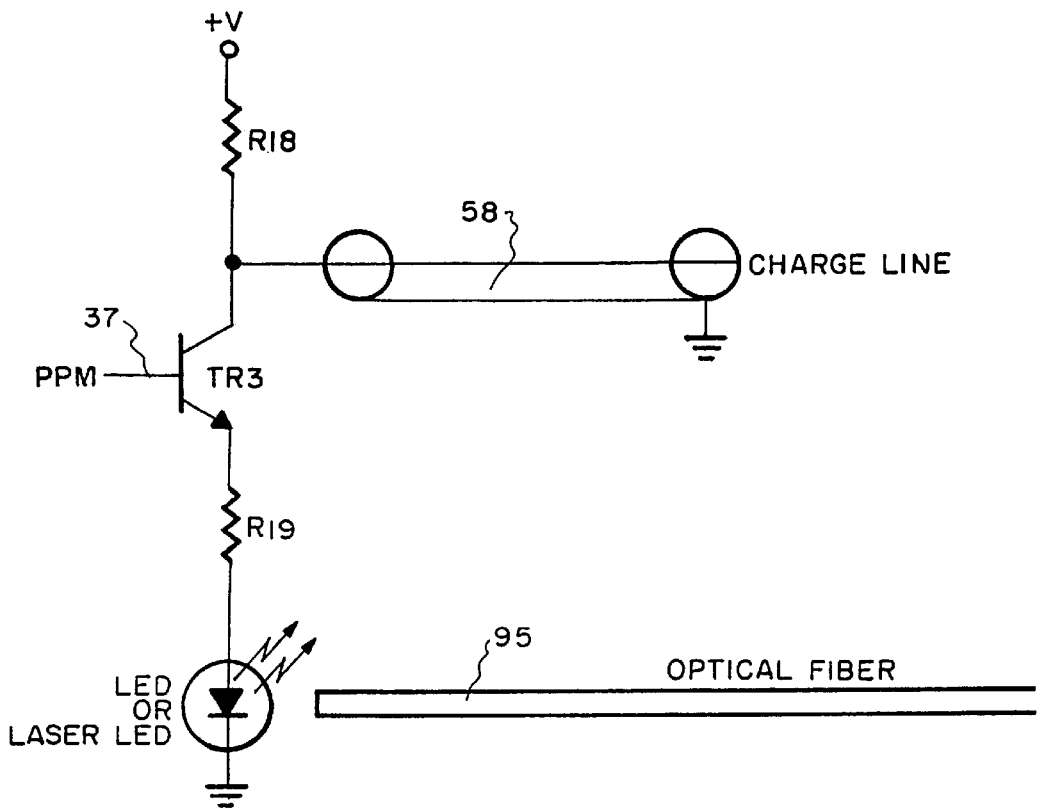
FIG. 10 is a schematic diagram of an alternate form of the invention in which a driver output is provided to an optical fiber transmission line.

FIG. 10 is a schematic diagram of an alternate form of the invention in which a driver output is provided to an optical fiber transmission line. Transistor TR3 has its collector connected through a resistor R18 to a positive voltage source +V. A delay line 58 used as a charge storage device has one of its terminals connected to the collector of TR3 while its other terminal is grounded. The emitter of TR3 is connected through a resistor R19 to the anode terminal of a light emitting diode LED, whose cathode is grounded. The PPM pulses 37 are applied to the base of TR3. An optical fiber 95 has one end exposed to the light generated by the LED.

In operation, in the circuit of FIG. 10 the voltage source +V normally holds the transistor near the breakdown condition for its collector-emitter forward conduction path. Charge line 58 is fully charged by current from +V. As each intermittent triggering pulse 37 is applied to the base of TR3, the transistor temporarily breaks down, and an avalanche of current flows from charge line 58 through the transistor. A voltage pulse applied through R19 to the LED causes a fluctuation in light emitted from it, which in turn is transmitted down the length of the optical fiber 95.

After each pulse generated by the circuit of FIG. 10, the charge line 58 is then recharged. As in the preferred embodiment of FIGS. 4 and 5, the resistance of resistor R18 is such as to prevent too rapid recharging, so that the transistor will not be destroyed by overly frequent energy pulses.

Figure 11:
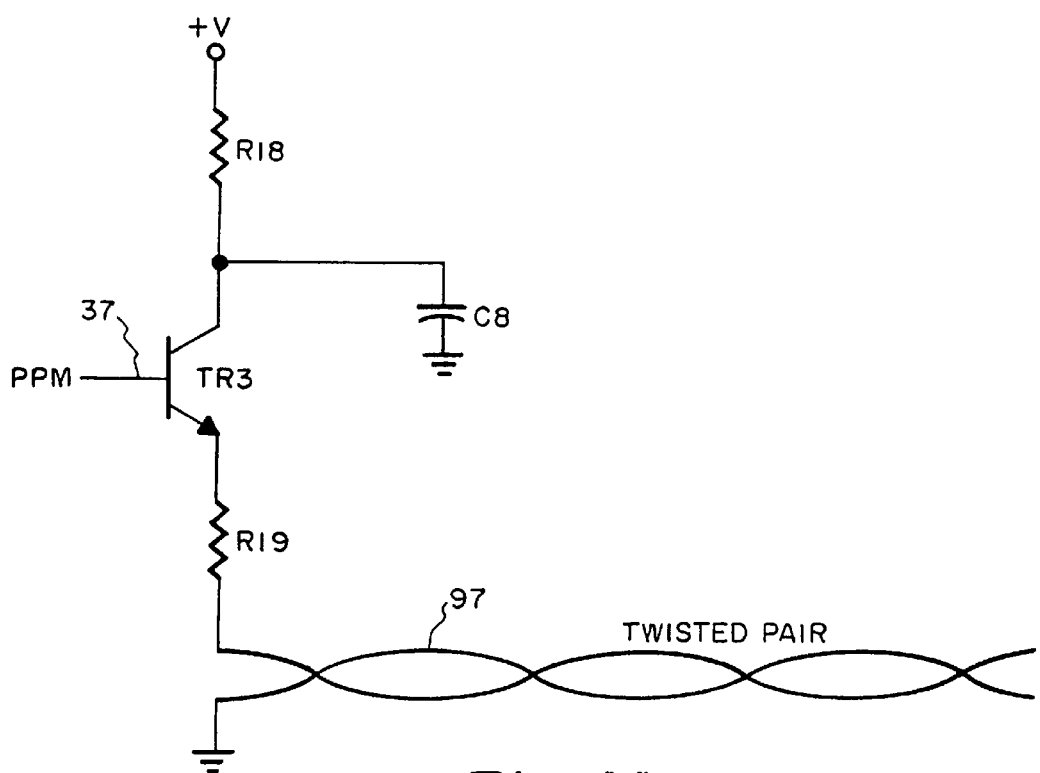
FIG. 11 is a schematic diagram of an alternate form of the invention in which a driver output is provided to a twisted pair transmission line.

FIG. 11 is a schematic diagram of an alternate form of the invention in which a driver output is provided to a twisted pair transmission line. Transistor TR3 has its collector connected through a resistor R18 to a positive voltage source +V. A capacitor 58 such as a delay line has one of its terminals connected to the collector of TR3 while its other terminal is grounded. The emitter of TR3 is connected through a resistor R19 to one lead of a twisted pair transmission line 97, whose other lead is grounded. The PPM pulses 37 are applied to the base of TR3.

In operation, in the circuit of FIG. 11 the voltage source +V normally holds the transistor near the breakdown condition for its collector-emitter forward conduction path. Capacitor C8 is fully charged by current from +V. As each intermittent triggering pulse 37 is applied to the base of TR3, the transistor temporarily breaks down, and an avalanche of current flows from capacitor C8 through the transistor. A voltage pulse applied through R19 to the input of the twisted pair transmission line then travels down the transmission line to a distant destination. The resistor R18 has a large value, as previously described.

RECEIVER AND DECODING CIRCUITRY

(FIGS. 6, 7, 12–15)

Figure 6:
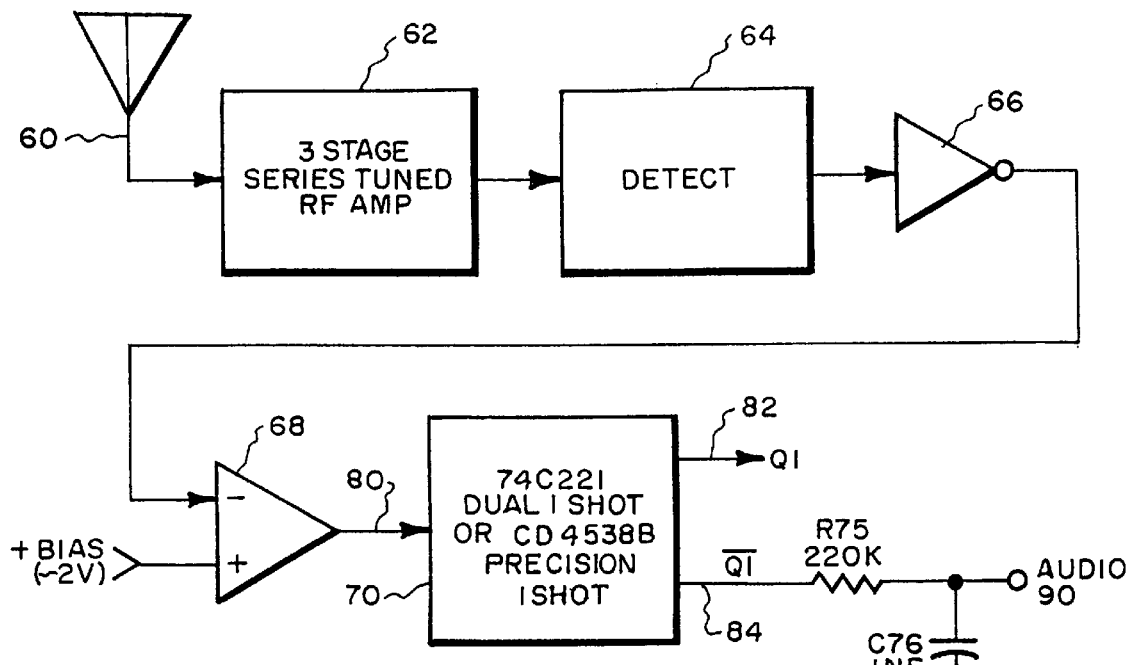
FIG. 6 is a schematic block diagram of alternate embodiment of the receiving and demodulation system of FIG. 1.
Figure 7:
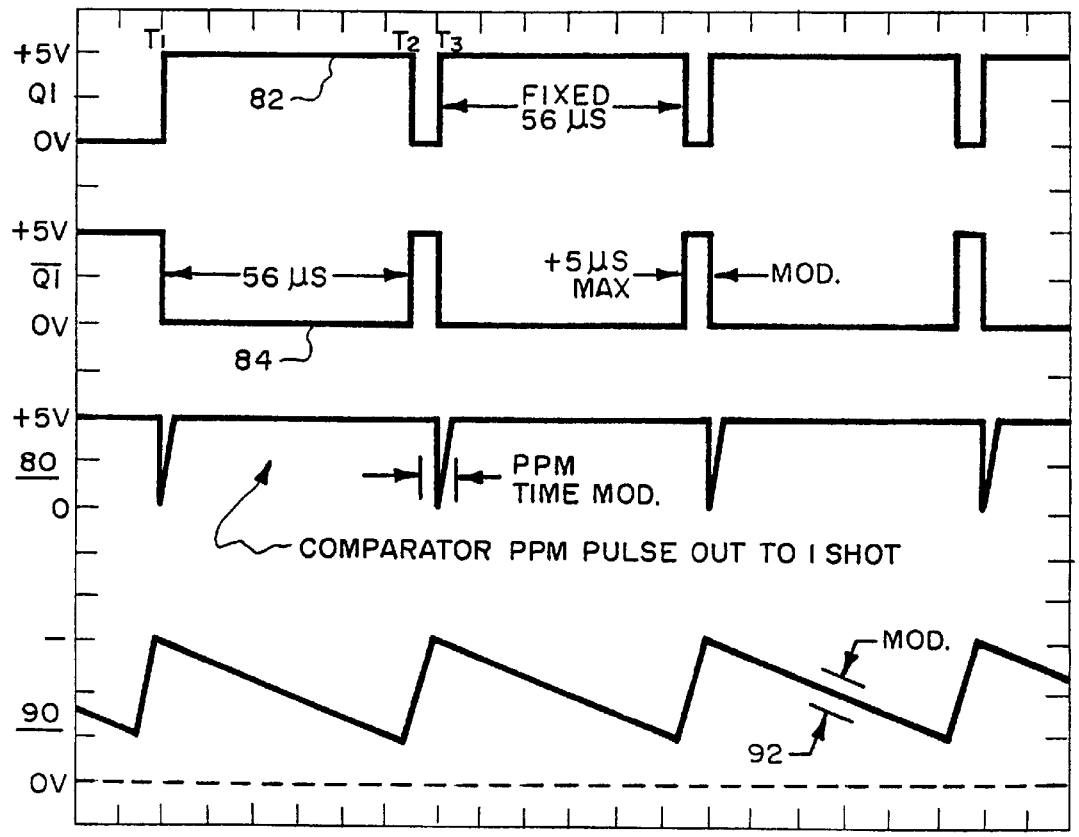
FIG. 7 shows the various voltage waveforms existing in the receiving and demodulation circuits.
Figure 12:
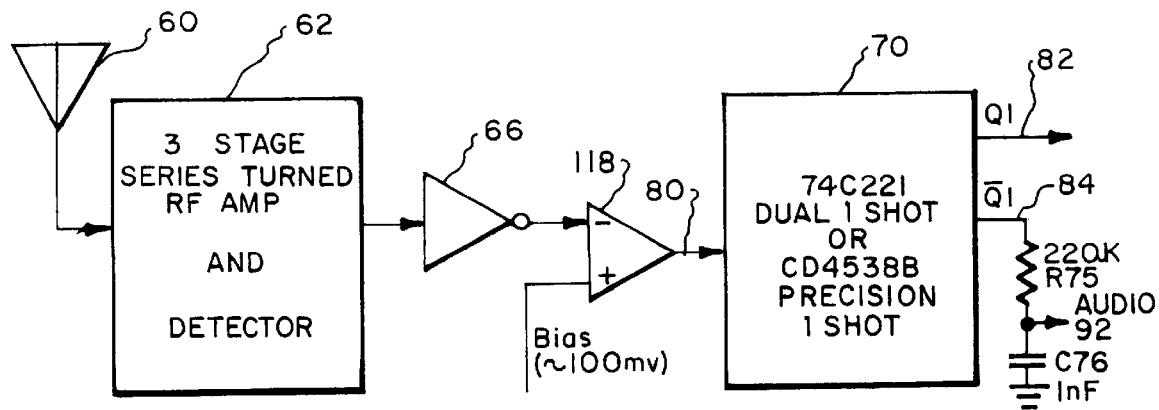
FIG. 12 is a schematic block diagram of the presently preferred embodiment of the receiving and demodulation system of FIG. 1.
Figure 15:
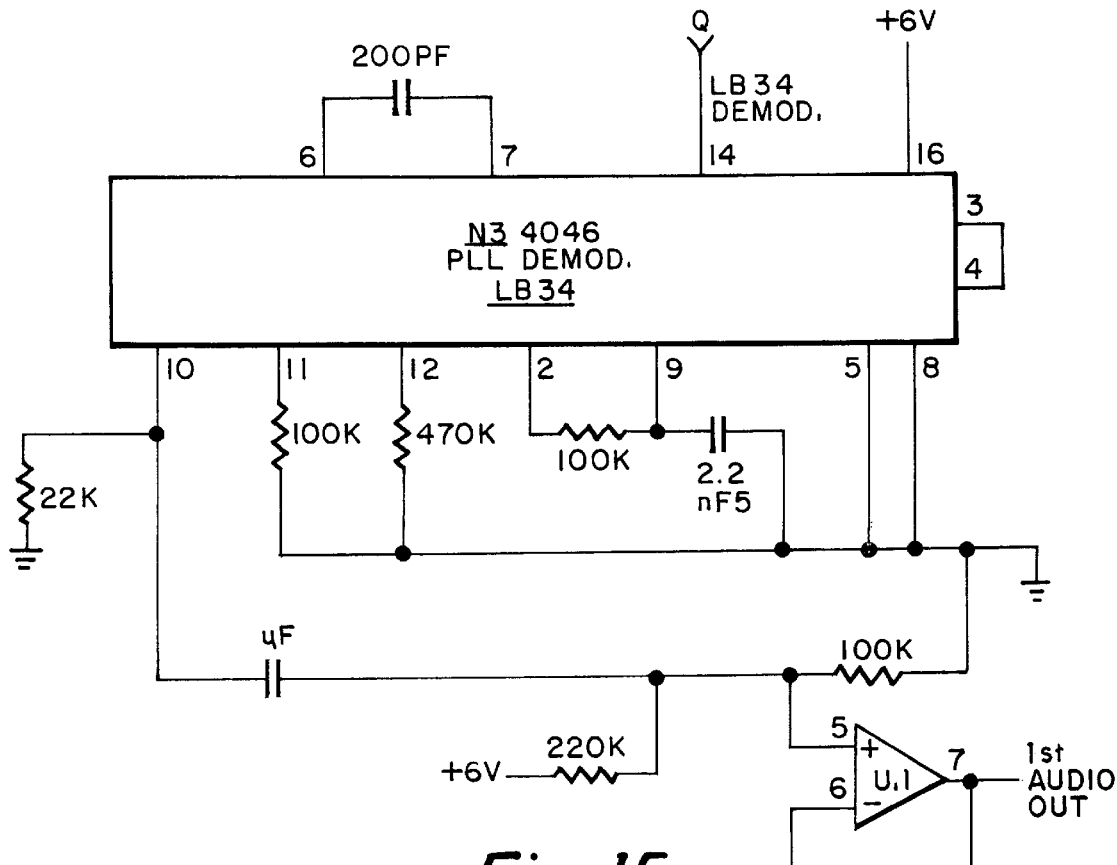
FIG. 15 is a schematic diagram of an alternate embodiment of the integrator portion of the receiver circuitry.
Figure 13A:
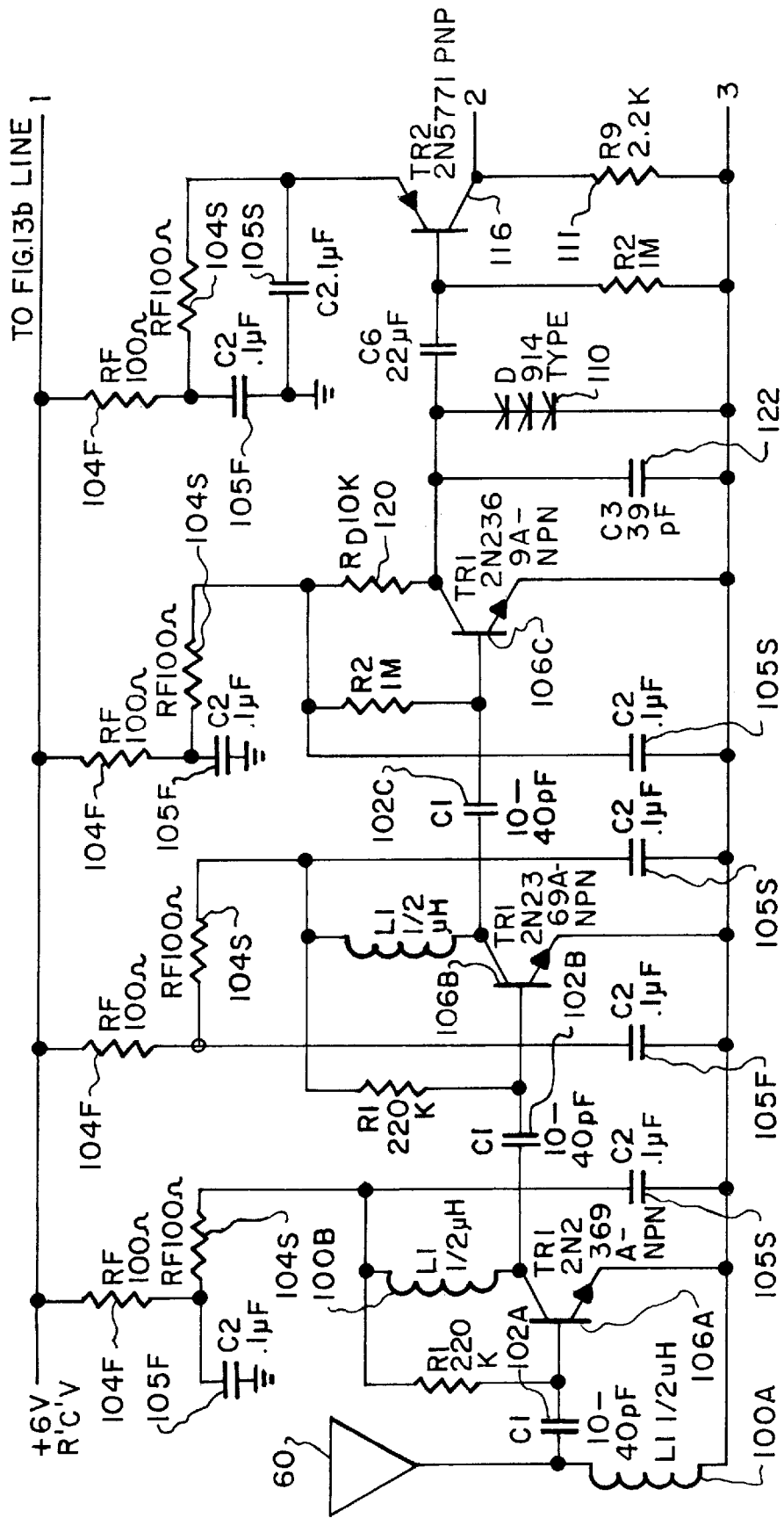
FIG. 13 is a detailed circuit diagram of the embodiment shown in FIG. 12.
Figure 13B:
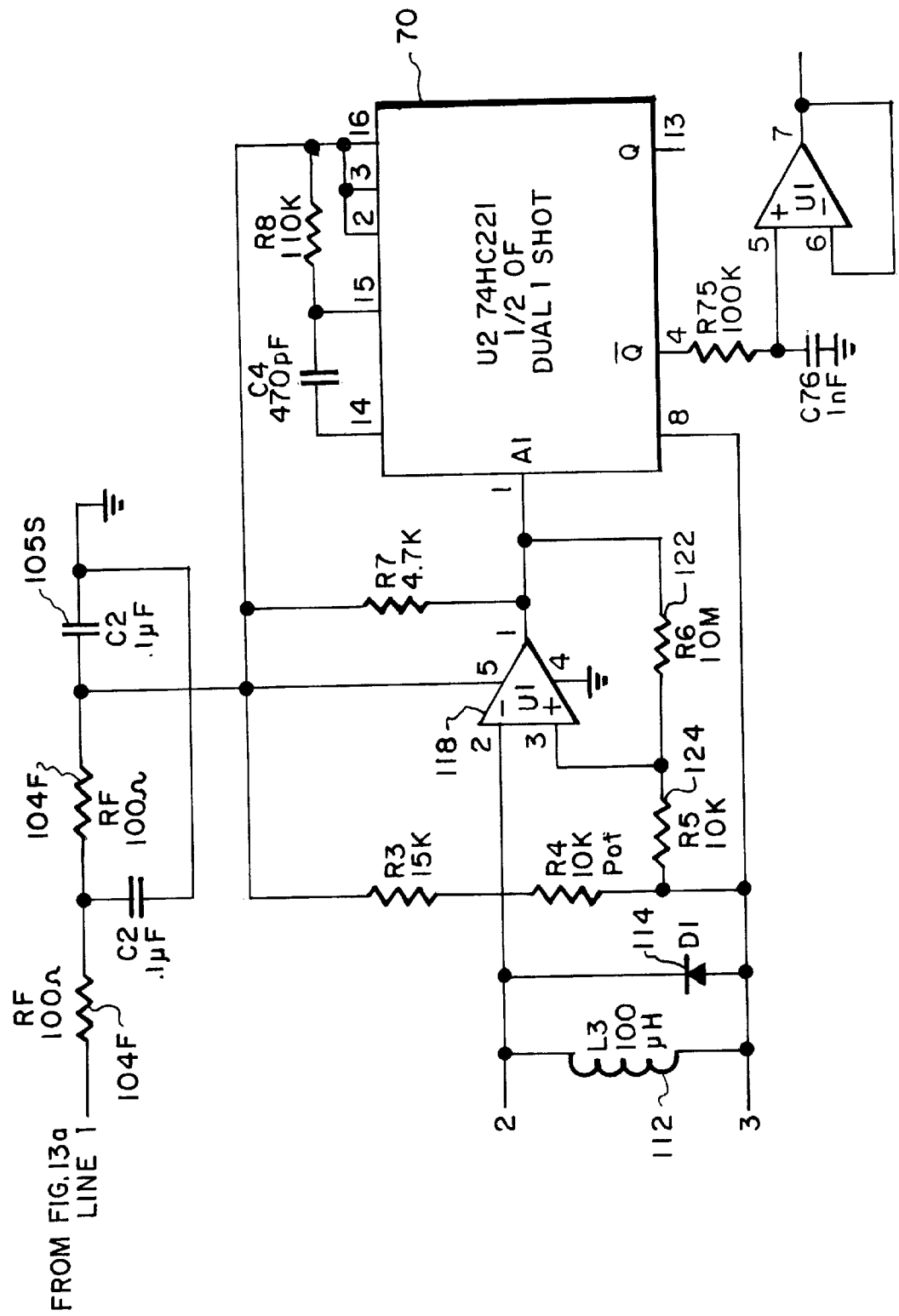
Figure 14:
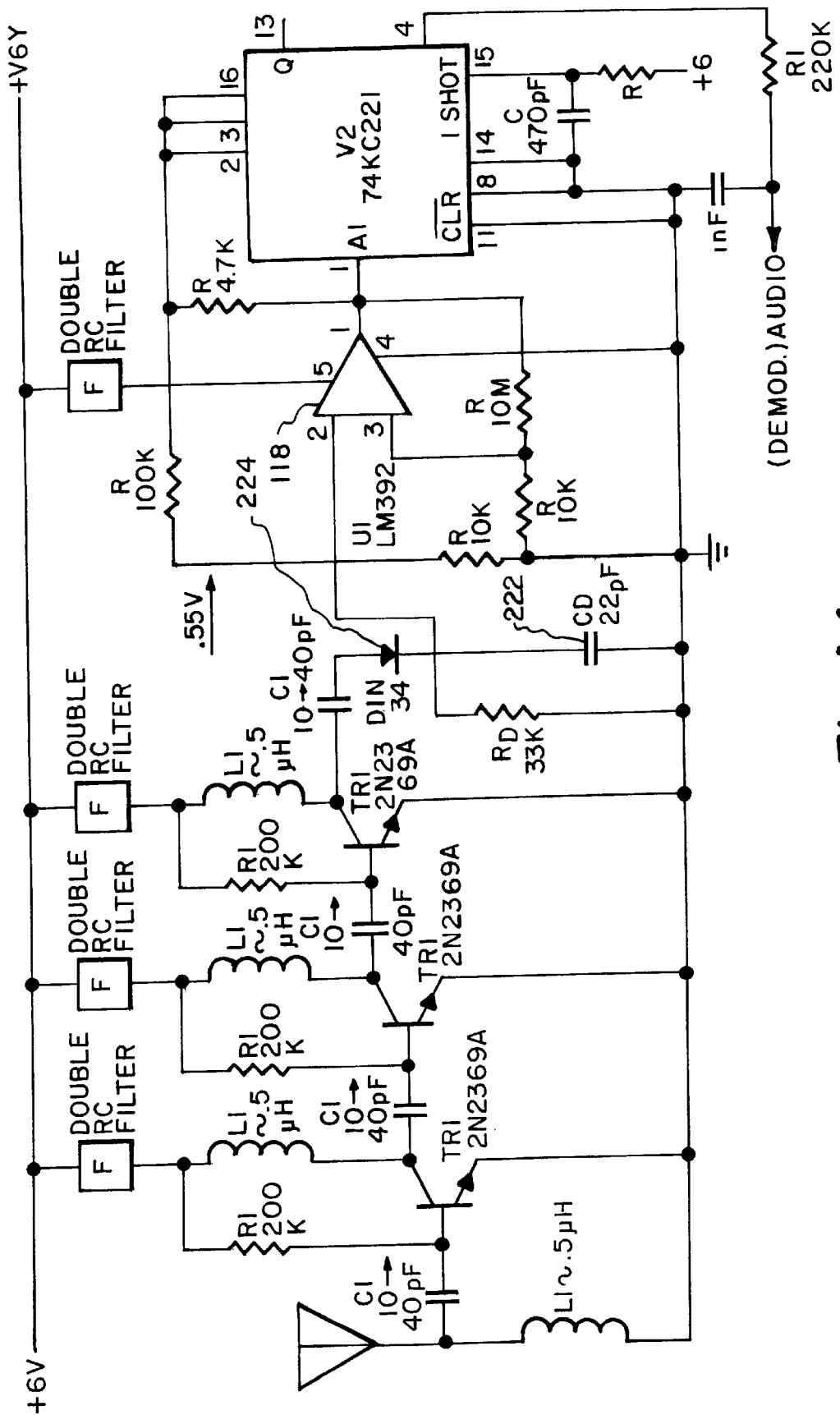
FIG. 14 is a detailed circuit diagram of an alternate embodiment of the receiving and demodulation system of FIG. 1.

Reference is now made to FIG. 6 showing a form of the receiving and decoding or demodulation system of FIG. 1 in a schematic block diagram form, and FIG. 7 showing the various voltage waveforms existing in the receiving and demodulation circuits. FIG. 12 is a block diagram of an alternate embodiment of the receiver circuitry. FIG. 13 is a detailed circuit diagram of the embodiment shown in FIG. 12. FIG. 14 is a detailed circuit diagram of an alternate embodiment of the receiver circuitry. FIG. 15 is an alternate embodiment of the integrator portion of the receiver circuitry.

It will be understood that the receiver is to receive and demodulate information signals transmitted with pulse position modulation such that the pulses have a normal unmodulated separation in time but when modulated form a pulse series in which the leading edge positions of the pulses vary from a periodic time reference in accordance with the information being transmitted.

As shown in FIGS. 6 & 12, signals received by an antenna 60 are fed to an amplifier 62. As shown in FIG. 13, the base of antenna 60 is inductively coupled to ground with inductor 100 and capacitively coupled to the input of the first amplifier stage via capacitor 102A. Capacitor 102A is adjustable through the range of 10 to 40 picofarads and is tuned such that the cooperation of capacitor 102A and inductor 100A allow passage of the approximately 50 Mhz information signal while essentially grounding and therefore blocking noise created by 60 Hz and auto spark plugs. Inductor 100A is selected as 0.5 microhenries.

Amplifier 62 is typically a three-stage series-tuned amplifier. The three stage series-tuned amplifier is used because it amplifies the pulses without significant pulse stretching. Although a parallel-tuned amplifier has been or can be used, series-tuned is preferred because series-tuned amplifiers do not "ring." Ringing increases the pulse width and therefore reduces the number of multiplexed PPM channels that could be decoded by a single receiver. In the worst case a parallel-tuned amplifier could cause succesive pulses of a single channel to overlap and thereby render the leading edges of the pulses and the information they represent indistinguishable.

The amplifier 62 can be any transistor with adequate gain at the operating frequency but, as shown is FIG. 13, typically is comprised of three 2N2369A NPN transistors 106A, 106B & 106C capacitively coupled with adjustable 10 to 40 picofarad capacitors 102B & 102C. Capacitors 102B & 102C cooperate with inductors 100B and 100C respectively such that capacitors 102B & 102C, as well as 102A, can be tuned to achieve optimum gain of the message signal through the amplifier stages.

DC power is coupled to amplifier transistors 106A, 106B & 106C via an isolation filter coupling. The isolation filter is needed to minimize circuit feedback through the amplifier's power supply coupling. Such feedback was found empirically to otherwise cause oscillations in the circuit. The embodiment shown in FIG. 13 utilizes two RC filters in series; a first filter comprised of resistor 104F and capacitor 105F, and a second filter comprised of resistor 104S and capacitor 105S. Resistors 104F & 104S are each 100 ohms. Capacitors 105F and 105S are each 0.1 microfarads. This provides a 4,000,000 times reduction in the voltage level of 50 MHz signal feedback noise through the amplifier. Isolation filters are also used to couple the power supply to PNP transistor 116, comparator 118, and monostable multivibrator 70, thereby essentially eliminating feedback noise or oscillation in the circuit.

In one embodiment of the invention, as shown in FIG. 6, the output of amplifier 62 can be made to flow to a detector 64 which is a basic active transistor detector with a negative output pulse about a half microsecond in width. The detector output can then be supplied to an inverting amplifier 66, which is preferably a simple one-stage transistor amplifier with an amplification factor of about 50. Thus a means for detecting the received pulses is provided by the detector 64.

In the presently preferred embodiment, as shown in FIGS. 12 & 13, transistor 106C and capacitor 122 together perform the function of a detector while also providing gain. Capacitor 122 is chosen as 39 picofarads and transistor 106C is provided with reduced collector current so that it operates in the non-linear mode. To achieve non-linear operation resistor 120 with a value of 10 k ohms is used. Transistor 106C operated in the non-linear stage or "starved stage" along with capacitor 122 are used in order to create a longer period output pulse instead of a more narrow amplified RF pulse. The longer period pulse is desired so that a lower frequency comparator can be used to respond to the amplified pulse. Hence, the third stage of the amplifier allows the amplified pulse to be more easily detected.

The output of the transistor 106C is clipped at 1.5 volts by clamping diodes 110. Resistor 120 causes the no signal DC collector voltage to be at about 1.2 volts and thereby causing the message signal voltage to oscillate about 1.2. Hence, the clamping diodes 110 essentially clip the positive portion of the information sine wave pulse. This helps prevent distortion at the output of PNP transistor 116.

PNP transistor 116, such as a 2N5771, is used to detect, invert, and in cooperation with inductor 112, further stretch the infomation pulse to ensure that comparator 118 can respond to the information signal. Inductor 112 is therefore chosen as 100 microhenries. PNP transistor 116 is preferred because a ground reference at the output is preferred for comparator 118 input.

A resistor 111 is coupled in parallel with inductor 112 so as to dampen any overshoot oscillations. Resistor 112 is therefore chosen as 2.2 k ohms. Diode 114, such as a 1N914 type diode, clips the negative portion of the information signal in order to help prevent saturation of comparator 118.

In the embodiment of FIG. 6, comparator 68 is preferably of type LM392, with the usual positive and negative inputs and a single output. A positive D.C. bias is applied to the positive or non-inverting input terminal, of such magnitude as to bias the comparator operation about 100 millivolts above the no signal rest potential of the negative input. This may typically require a positive bias of about 2 volts if an NPN transistor is used as inverting amplifier 66. The detected and amplified incoming pulses received from amplifier 66 are then applied to the negative or inverting input terminal of the comparator 68.

In the embodiment of FIGS. 12 & 13, comparator 118 is preferably of type LM392. As is common in the art, comparator 118 has a feedback loop 122 from the comparator output to the comparator non-inverting input so that when the information pulse is detected by the inverting or negative input, the output more quickly responds to the signal applied to the inverting input. The non-inverting input bias voltage level can be changed using potentiometer resistor 124 so that the inverting input ignores noise but responds to the information signal at a predetermined level above the normal DC voltage bias. To this end, potentiometer 124 typically is adjusted to bias the non-inverting input approximately 100 milivolts above the inverting input.

When comparator 68 or 118 is triggered in response to one of the incoming pulses, it produces a waveform 80 consisting of negative output pulses with a magnitude of about 5 volts. The waveform 80 for the PPM pulses that are output from the comparator 68 is shown as the third voltage waveform in FIG. 7. These negative output pulses then trigger a one-shot multivibrator 70, which has an input and an output NOT Q1.

The comparator stage 68 or 118 is just a convenient high gain circuit to recover accurately the start time of the PPM pulse. In fact, the detection, amplification, and comparator circuitry 64, 66 & 68 or 118 would not be necessary when using a higher gain amplifier stage and a more high frequency sensitive monostable multivibrator. As a result the amplified PPM pulse may be input into and detected directly by the monostable multivibrator 70.

The series of detected pulses are then applied to the input of the multivibrator, producing at output Q1 a series of pulses 82 at the high voltage level whose width varies in accordance with the transmitted information. Pulse width modulated pulses are referred to as PWM pulses. Thus, the multivibrator converts PPM modulation to PWM modulation The multivibrator 70 also has a complementary output NOT Q1 which produces pulses 84.

The output NOT Q1 of the multivibrator produces an output which is at a low voltage level for a fixed period of time such as 56 microseconds that is somewhat less than the normal time separation of 61 microseconds between pulses. Specifically, the fixed 56 microsecond time period is less than the 61 microsecond periodic time reference by more than the anticipated maximum variation of the leading edges of the PPM signals. The multivibrator NOT Q output then reverts to a high voltage level, and when triggered by the next PPM pulse switches the output voltage from the high voltage level to the low voltage level again.

The monostable multivibrator can be a type 74HC221. With the B and NOT RESET inputs tied high, the multivibrator provides a low voltage at the NOT Q output in response to transitions from high to low at the NOT A input.

In the preferred embodiment of the invention, as shown in FIG. 3, the length of the clock pulse cycle is 61 microseconds. Only one sawtooth ramp is generated in response to each repetition of the clock pulse. Thus, the nominal or unmodulated time separation between the leading edges of transmitted pulses is 61 microseconds, although of course the actual time position of each individual pulse varies in accordance with the transmitted intelligence.

One function of the multivibrator 70 is to shut out noise or interference during most of each time when no intelligence-bearing pulse is going to be received. The multivibrator therefore has a fixed output about 56 microseconds in length during which its input will not respond to a new pulse. This allows the incoming intelligence-bearing PPM pulses to be spaced about plus or minus 5 microseconds from their nominal or unmodulated time position and still be passed through the multivibrator.

As a result, multipath distortion typically found in cordless or cellular phones using frequency modulation is blocked because once the multivibrator has been triggered by a pulse, any following pulse is not recognized until the fixed time has expired. For this purpose and to conserve power, the NOT Q1 output of the multivibrator 70 also may be used, with appropriate circuitry obvious to one skilled in the art, to turn off the amplifier and associated circuitry between PPM pulses.

It should be noted that a transmitter synchronized clock signal is not necessary for decoding the information signal. Thus, the pulse position modulated information signal need not contain a synchronization pulse and the receiver circuitry need not contain the transmitter clock or a reproduction of the transmitter clock. The separation between successive PPM pulses represents the changes in amplitude of the sampled original information signal. The pulse position modulated pulses are then converted to pulse width modulated signals by the monostable multivibrator.

The pulse position to pulse width modulation is accomplished by causing the triggering edge of the input pulse to be delayed in time (by about 56 microseconds in this embodiment) until the next succeeding pulse arrives to determine the width of the pulse width modulated signal at the NOT Q output. Hence, the width of each PWM pulse varies in accordance with the advance or delay of the succeeding PPM pulse with respect to the preceding PPM pulse.

In other words, a PPM pulse at the input of the monostable multivibrator causes the NOT Q output of multivibrator 70 to immediately go low and return high 56 microseconds later. The NOT Q output stays high until the next succeeding pulse arrives and causes the NOT Q output of multivibrator 70 to go low thereby defining the width of the pulse width modulated signal and simultaneously causing the NOT Q output to go high 56 microseconds later. Therefore, the width of the pulse width modulated signal is determined by the relative change in position between the leading edge of sucessive PPM pulses.

Note also that although the PWM pulses are separated by 56 microseconds, they do not occur at regular periodic time intervals. Fifty six microseconds is measured between the falling edge of one pulse and the rising edge of the next succeeding pulse. Since the falling edge varies, the positions of the leading edges of succesive PWM pulses are not periodic.

From the multivibrator the output signal on NOT Q1 is fed to a low-pass filter circuit consisting of a resistor R75 in series and a capacitor C76 in shunt, which responds to the PWM pulses, which vary in time width, to produce waveform 90 with integrated pulse signals as shown in FIG. 7. A typical value for R75 is 220 k ohms, and for C76 is 1 nanofarad. It is important that the R-C time constant of resistor R75 and capacitor C76 is substantially greater than 61 microseconds. From the low-pass filter circuit the integrated pulses 90 which are now amplitude modulated are fed to an audio circuit to recover the original information signal.

Thus the R-C low-pass circuit is coupled to the multivibrator NOT Q1 output for producing voltage waves each having a rising voltage that spans the time duration of the associated high voltage level square pulse, and whose decaying voltage amplitude is varied in accordance with the maximum voltage attained by the trailing edge of the associated high voltage level square pulse. The monostable multivibrator in cooperation with the R-C integrator, in effect, lock on to the PPM pulses to produce the amplitude modulated signal.

The preferred embodiment thus described utilizes an R-C low-pass circuit in the near linear region of the R-C charge curve. In alternate embodiments of the invention, amplitude modulated signals may be produced by utilizing an integrator such as an op-amp integrator. In other embodiments, amplitude modulated signals can be produced in the same manner by utilizing an op-amp sample and hold or a phase locked loop. In yet another embodiment, the amplified PPM pulse may be directly supplied to a high gain audio amplifier and loudspeaker which would act as the integrator and thereby reproduce the audio signal.

In FIG. 7 the first voltage waveform 82 shown is that for the Q1 output of the multivibrator 70, which is normally high but becomes negative at intermittent intervals. The second voltage waveform 84 shown in FIG. 7 is for NOT Q1, and this is simply an inverted image of the Q1 waveform. The time from the ending of each of the positive pulses 84 to the beginning of the next positive pulse is 56 microseconds, for the reasons described above. The actual duration of the positive pulses, however, varies in accordance with the received intelligence.

In FIG. 7 the third voltage waveform 80 shown is that for the negative PPM pulses that are output from the comparator 68 and which are the input to multivibrator 70.

It should be noted that another advantage of the T2 fixed time delay of the T1 time of the last PPM pulse is that it gives a much narrower PPM pulse which in effect amplifies the small PPM time delay.

The fourth waveform 90 shown in FIG. 7 is the integrated signal. Arrows 92 indicate how the time position of each declining voltage ramp may vary in accordance with the received information signal. The no signal rest state of the circuit produces at 92 a constant 6 volt signal because no signal at the NOT A input of the monostable multivibrator produces 6 volts at the NOT Q output. As the circuit reaches steady state in response to a continuous train of PPM input pulses, the signal 90 responds such that the maximum amplitude of the waveform is approximately 300 milivolts and the minimum amplitude is approximately 100 milivolts with a modulation of about 50 milivolts.

The integrated signal 90 is fed to the audio circuit, where the original message signal is recovered. For a tone at the PPM frame pulse rate, the full amplitude is recovered. At lower frequencies it is a difference amplitude that is recovered. This means that the audio amplifier must gradually increase its gain for lower frequency tones analogous to pre-emphasis used in phonograph pickups.

FIG. 14 shows an alternative embodiment wherein the third stage of the series tuned amplifier is fed to a simple detector circuit comprised of diode 224 and capacitor 222. The output of the detector is fed to comparator 118.

While the description thus described uses the NOT Q1 output 84 for use in demodulation, Q1 output 82 could be used for demodulation in any number of ways obvious to one ordinarily skilled in the art. For example, the complement of signal 80 could be used as an input. Another example shown in FIG. 15 utilizes a phase locked loop connected to the Q output of the monostable multivibrator.

While the presently preferred embodiment has been described with reference to single-channel and one-way communication, the present invention is by no means thus limited. The same system may be used for both duplex and multiplex communication. By including a synchronizing clock circuit in the receiver it is possible to utilize the same receiver to receive messages on a plurality of channels simultaneously. In the described embodiment the duration of each pulse is only about 20 nanoseconds, equivalent to a continuous wave frequency of 50 Megahertz. Yet the time interval between unmodulated pulses sent from a single transmitter is about 60 microseconds. Thus, the receiver while receiving single channel transmission is operating less than 1/1000 of the time. Signals may be sent sequentially from multiple different signal channels. It is therefore possible to receive as many as fifty channels on a single receiver without overloading or damaging the circuitry.

When multiple channels are being received concurrently, a time multiplex system is used that will adequately distinguish among the various separate channels.

While the invention has been described with particular reference to radio transmission, cordless phones, cellular phones, or the like, it is also suited for use in RADAR systems or other systems for communicating information electronically.

What we claim is:

1. A circuit for receiving and decoding information contained in a train of pulse position modulated signals comprising:
   (a) an antenna for receiving the train of pulse position modulated signals unaccompanied by clock signals;
   (b) a series tuned amplifier circuit having an input and an output, the amplifier input being coupled to the antenna for producing a train of amplified pulse position modulated signals at the output of the series tuned amplifier circuit; and
   (c) a decoder circuit having an input and an output, the decoder input being coupled to the amplifier output for decoding the train of amplified pulse position modulated signals and producing an amplitude modulated signal at the decoder output without utilizing transmitter synchronized clock signals.

2. The circuit of claim 1 wherein the amplifier circuit further comprises an input power supply coupled to the amplifier through an isolation filter.

3. The circuit of claim 1 wherein the antenna is capacitively coupled to the amplifier and inductively coupled to ground.

4. A circuit for receiving and decoding information contained in a train of pulse position modulated signals comprising:
   a) an antenna for receiving the train of pulse position modulated signals unaccompanied by clock signals;
   b) an amplifier circuit having an input and an output, the input being coupled to the antenna for producing a train of amplified pulse position modulated signals at the output of the amplifier circuit; and
   c) a decoder circuit having an input and an output, the decoder input being coupled to the amplifier output for decoding the train of amplified pulse position modulated signals and producing an amplitude modulated signal at the decoder output without utilizing transmitter synchronized clock signals.

5. The circuit of claim 1 wherein the decoder further comprises:
   a) a pulse position to pulse width modulator having an input and an output, the input being coupled to the amplifier output; and
   b) a pulse width to amplitude modulator having an input and an output, the input being coupled to the pulse position to pulse width modulator output thereby producing an amplitude modulated signal at the pulse width to amplitude modulator output.

6. The circuit of claim 1 wherein the decoder further comprises a monostable multivibrator having an input and an inverting output, the monostable multivibrator being capable of producing a low signal for a predetermined fixed time period at the inverting output in response to a transition from high to low at the input.

7. The circuit of claim 6 wherein the decoder further comprises an integrator having an input and an output, the integrator input being coupled to the monostable multivibrator inverting output thereby producing an amplitude modulated signal at the integrator output.

8. The circuit of claim 7 wherein the integrator further comprises a filter comprised of a resistor and a capacitor, one end of the resistor being coupled to the monostable multivibrator inverting output, the capacitor being coupled between a second end of the resistor and ground, the second end of the resistor thereby producing an amplitude modulated signal.

9. The circuit of claim 8 wherein the decoder further comprises:
   a) an inverter interposed between the amplifier and the monostable multivibrator, having an input and an output, the input being coupled to the output of the amplifier circuit; and
   b) a comparator having an inverting input, a non-inverting input, and an output, the inverting input being coupled to the inverter output, the non-inverting input being positively biased such that a negative going pulse is produced at the comparator output in response to a positive going pulse at the inverting input, and the comparator output being coupled to the input of the monostable multivibrator.

10. A circuit for receiving and decoding information contained in a train of pulse position modulated signals wherein the train comprises very short and widely separated high frequency sine-wave pulses of electrical energy, each of the pulses having a leading edge, the circuit comprising:
    (a) an antenna for receiving the train of pulse position modulated signals;
    (b) a series tuned amplifier circuit having an input and an output, the amplifier input being coupled to the antenna for producing a train of amplified pulse position modulated signals at the output of the series tuned amplifier circuit; and
    (c) a decoder circuit having an input and an output, the decoder input being coupled to the amplifier output, the decoder circuit being capable of detecting and converting the leading edge positions of successive pulses of the train of amplified pulse position modulated signals to amplitude modulated signals at the decoder output.

11. The circuit of claim 10 wherein the amplifier circuit further comprises an input power supply coupled to the amplifier through an isolation filter.

12. The circuit of claim 10 wherein the antenna is capacitively coupled to the amplifier and inductively coupled to ground.

13. A circuit for receiving and decoding information contained in a train of position modulated signals wherein the train comprises very short and widely separated high frequency sine-wave pulses of electrical energy, each of the pulses having a leading edge, the circuit comprising:
 a) an antenna for receiving the train of pulse position modulated signals;
 b) an amplifier circuit having an input and an output, the input being coupled to the antenna for producing a train of amplified pulse position modulated signals at the output of the amplifier circuit; and
 c) a decoder circuit having an input and an output, the decoder input being coupled to the amplifier output, the decoder circuit being capable of detecting and converting the leading edge positions of successive pulses of the train of amplified pulse position modulated signals to amplitude modulated signals at the decoder output.

14. The circuit of claim 13 wherein the decoder further comprises:
 a) a pulse position to pulse width modulator having an input and an output, the input being coupled to the amplifier output; and
 b) a pulse width to amplitude modulator having an input and an output, the input being coupled to the pulse position to pulse width modulator output thereby producing an amplitude modulated signal at the pulse width to amplitude modulator output.

15. The circuit of claim 10 wherein the decoder further comprises:
 a) a monostable multivibrator having an input and an inverting output, the input being coupled to the amplifier output; and
 b) a filter comprised of a resistor and a capacitor, one end of the resistor being coupled to the monostable multivibrator inverting output, the capacitor being coupled between a second end of the resistor and ground, the second end of the resistor thereby producing an amplitude modulated signal.

16. The circuit of claim 15 wherein the decoder further comprises:
 a) an inverter interposed between the amplifier and the monostable multivibrator, having an input and an output, the input being coupled to the output of the amplifier circuit; and
 b) a comparator having an inverting input, a non-inverting input, and an output, the inverting input being coupled to the inverter output, the non-inverting input being positively biased such that a negative going pulse is produced at the comparator output in response to a positive going pulse at the inverting input, and the comparator output being coupled to the input of the monostable multivibrator.

17. A circuit for receiving and decoding information contained in a train of position modulated signals wherein the train comprises very short and widely separated high frequency sine-wave pulses of electrical energy, the circuit comprising:
 a) an antenna for receiving the train of pulse position modulated signals;
 b) an amplifier circuit having an input and an output, the input being coupled to the antenna for producing amplified pulse position modulated signals at the output of the amplifier circuit; and
 c) a decoder circuit having an input and an output, the decoder input being coupled to the amplifier output, the decoder circuit having the capability of locking onto the train of amplified pulse position modulated signals and converting the amplified pulse position modulated signals into amplitude modulated signals.

18. The circuit of claim 17 wherein the amplifier circuit is a series tuned amplifier circuit.

19. The circuit of claim 18 wherein the amplifier circuit further comprises an input power supply coupled to the amplifier through an isolation filter.

20. The circuit of claim 18 wherein the antenna is capacitively coupled to the amplifier and inductively coupled to ground.

21. The circuit of claim 17 wherein the decoder further comprises:
 a) a pulse position to pulse width modulator having an input and an output, the input being coupled to the amplifier output; and
 b) a pulse width to amplitude modulator having an input and an output, the input being coupled to the pulse position to pulse width modulator output thereby producing an amplitude modulated signal at the pulse width to amplitude modulator output.

22. The circuit of claim 17 wherein the decoder further comprises:
 a) a monostable multivibrator having an input and an inverting output, the input being coupled to the amplifier output; and
 b) a filter comprised of a resistor and a capacitor, one end of the resistor being coupled to the monostable multivibrator inverting output, the capacitor being coupled between a second end of the resistor and ground, the second end of the resistor thereby producing an amplitude modulated signal.

23. The circuit of claim 22 wherein the decoder further comprises:
 a) an inverter interposed between the amplifier and the monostable multivibrator, having an input and an output, the input being coupled to the output of the amplifier circuit; and
 b) a comparator having an inverting input, a non-inverting input, and an output, the inverting input being coupled to the inverter output, the non-inverting input being positively biased such that a negative going pulse is produced at the comparator output in response to a positive going pulse at the inverting input, and the comparator output being coupled to the input of the monostable multivibrator.

24. A receiver for receiving and demodulating information signals transmitted with pulse position modulation such that the pulses have a normal unmodulated separation in time but form a pulse series in which the time separation of the pulses varies in accordance with the information being transmitted, comprising:
 (a) means for detecting received pulses;
 (b) a one-shot multivibrator having an input and an output, the multivibrator producing a low voltage level at the output for a fixed period of time that is somewhat less than the normal time separation between pulses, and then reverting to a high voltage level, the multivibrator when triggered by the next pulse then switching the output voltage from the high voltage level to the low voltage level;
 (c) means for applying the series of detected pulses to the input of the multivibrator, thereby producing at the output a series of high voltage level pulses whose width varies in accordance with the transmitted information; and (d) an R-C low-pass circuit coupled to the multivibrator output for producing voltage waves each having a rising voltage that spans the time duration of the associated high voltage level square pulse and whose decaying voltage level is varied in amplitude in accordance with the maximum voltage attained by the trailing edge of the associated high voltage level pulse.

25. A receiver for receiving and demodulating fixed length information signals transmitted with pulse position modulation such that the pulses have a normal unmodulated separation in time but form a pulse series in which the time positions of the leading edges of the pulses vary in accordance with the information being transmitted, the receiver comprising:

(a) a means for receiving the series of pulses;

(b) a means responsive to the received pulses for producing a steady state voltage level at an output for a fixed period of time that is somewhat less than the normal time position of the leading edges between the pulses and then reverting to a pre-response pulse level, the responsive means being capable of responding to a succeeding input voltage pulse after the output has returned to the pre-response voltage level, the responsive means being capable of responding to successive pulses in the series of received pulses;

(c) a means for applying the series of received pulses to the responsive means, thereby producing at the responsive means output a series of pulses whose widths vary in accordance with the transmitted information; and (d) a means coupled to the responsive means output for producing voltage waves each having a rising voltage that spans the time duration of the associated responsive means output pulse and whose decaying voltage level is varied in amplitude in accordance with the maximum voltage attained in response to the duration of the associated responsive means output pulse.

26. A circuit for decoding information contained in a train of fixed length pulses wherein the information is contained in the time separation between pulses, the circuit comprising:

a) an amplifier circuit having an input and an output, the amplifier being capable of producing an amplified train of pulses at the amplifier output in response to a train of pulse position modulated pulses at the amplifier input; and b) a means for shutting out interference having an input and an output, the input being coupled to the amplifier output, the shutting out means being capable of detecting an initial pulse of the amplified train and thereafter not responding to any subsequent pulses until a predetermined fixed time period has elapsed and thereafter being capable of detecting a next subsequent pulse of the train thereby shutting out noise and interference during the time period, the shutting out means being capable of producing at the shutting out means output a train of pulse width modulated signals in response to the train of pulse position modulated pulses applied to the shutting out means input without utilizing a transmitter synchronized clock signal.

27. The circuit of claim 26 wherein the amplifier circuit is a series tuned amplifier circuit.

28. The circuit of claim 26 wherein the shutting out means further comprises a monostable multivibrator having an input and an inverting output, the monostable multivibrator being capable of producing a low signal for a predetermined fixed time period at the inverting output in response to a transition from high to low at the input.

29. A circuit for receiving and decoding information contained in a train of position modulated signals wherein the train comprises very short and widely separated high frequency sine-wave pulses of electrical energy, the circuit comprising:

a) an antenna for receiving the train of pulse position modulated signals unaccompanied by clock signals;

b) an amplifier circuit having an input and an output, the amplifier being capable of producing an amplified train of pulses at the amplifier output in response to the train of pulse position modulated pulses at the amplifier input; and c) a decoder circuit having an input and an output, the decoder input being coupled to the amplifier output for decoding the train of amplified pulse position modulated signals and producing an amplitude modulated signal at the decoder output without utilizing a transmitter synchronized clock signal, the decoder circuit having a means for shutting out interference, the shutting out means being capable of detecting an initial pulse of the amplified train and thereafter not responding to any subsequent pulses until a predetermined fixed time period has elapsed and thereafter being capable of responding to a next subsequent pulse of the train thereby shutting out noise and interference during the time period.

30. A method of receiving and decoding widely spaced pulse position modulated signals whose leading edge positions vary from a periodic time reference, the method comprising the steps of:

a) in response to the pulse position modulated signals, creating a series of pulse width modulated signals in which the time separation between the end of each pulse width modulated pulse and the beginning of the next pulse width modulated pulse is a fixed time interval that is less than the time period of the periodic time reference by an amount that is greater than the anticipated maximum variation of the leading edge positions of the pulse position modulated signals from the periodic reference; and b) in response to the pulse width modulated signals, producing a series of amplitude modulated pulses in which the magnitude of each amplitude modulated pulse represents the time duration of a corresponding pulse width modulated pulse.

31. A method of receiving and decoding information, the method comprising the steps of:

(a) receiving a train of very short essentially single cycle sine-wave pulses separated in time, wherein the time position of successive pulses represents the information being transmitted;

(b) locking onto the train of pulses such that once an individual pulse has been sensed, a subsequent pulse can be sensed only after a predetermined period;

(c) producing a train of output signal pulses in response to the sensed pulses wherein the information is contained in the width of the output signal; and (d) then converting the train of output signal pulses to an amplitude modulated signal.

32. A method of receiving and decoding information, the method comprising the steps of:

(a) receiving a train of very short essentially single cycle sine-wave pulses separated in time, wherein the time position of successive pulses represents the information being transmitted;

(b) locking onto the train of pulses such that once an individual pulse has been sensed, a subsequent pulse can be sensed only after a predetermined period;

(c) producing a train of output signal pulses in response to the sensed pulses wherein the information is contained in the width of the output signal; and (d) first time-de-multiplexing the received train of pulses prior to producing the train of output signal pulses.

33. The method of claim 30 wherein the step of decoding further comprises the steps of:

a) converting the received pulse train such that the information contained in the separation between each pulse signal becomes contained in the width of each pulse of a pulse train; and b) integrating the converted pulse train thereby producing an amplitude modulated signal.

* * * * *